(12) United States Patent
Shiraishi

(10) Patent No.: US 6,285,455 B1
(45) Date of Patent: Sep. 4, 2001

(54) MARK DETECTION METHOD, OPTICAL SYSTEM AND MARK POSITION DETECTOR

(75) Inventor: Naomasa Shiraishi, Urawa (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/573,223

(22) Filed: May 19, 2000

Related U.S. Application Data (63) Continuation of application No. PCT/JP98/05226, filed on Nov. 19, 1998.

(30) Foreign Application Priority Data

Nov. 20, 1997 (JP) ..................................................... 9-319239

(51) Int. Cl.⁷ ........................................................ C01B 9/02
(52) U.S. Cl. ........................................... 356/486; 356/499
(58) Field of Search .................................... 356/488, 494, 356/499, 401, 486; 250/548

(56) References Cited

U.S. PATENT DOCUMENTS

| | | |
|---|---|---|
| 4,962,318 * | 10/1990 | Nishi ..................... 356/401 |
| 5,151,750 | 9/1992 | Magome et al. . |
| 5,721,605 | 2/1998 | Mizutani . |
| 5,861,320 * | 1/1999 | Shiraishi ..................... 438/16 |

FOREIGN PATENT DOCUMENTS

| | | |
|---|---|---|
| 63-240018 | 10/1988 | (JP) . |
| A 2-283011 | 11/1990 | (JP) . |
| A 6-260389 | 9/1994 | (JP) . |
| A 7-321030 | 12/1995 | (JP) . |
| A-8-250391 | 9/1996 | (JP) . |
| PCT/JP98/ 05226 | 11/1998 | (WO) . |

* cited by examiner

Primary Examiner—Samuel A. Turner
(74) Attorney, Agent, or Firm—Oliff & Berridge, PLC (57) ABSTRACT

A position detection method detects the position of a mark formed at the bottom of a film such as a polysilicon layer which transmits no visible light. A flattened alignment mark is formed on a wafer, onto which the pattern on a reticle is transferred. A polysilicon film is formed on the alignment mark. An alignment sensor includes a laser light source and a frequency shifter, which produce light beams having wavelengths between 800 and 1500 nm and differing slightly in frequency from each other. The beams are radiated through a projection optical system and transmitted by the polysilicon film to irradiate the alignment mark. The diffracted light from the alignment mark is received through the optical system by a photoelectric detector. On the basis of the signal detected by the photoelectric detector, the position of the alignment mark is detected.

29 Claims, 5 Drawing Sheets

MARK DETECTION METHOD, OPTICAL SYSTEM AND MARK POSITION DETECTOR

CROSS-REFERENCE

This application is a Continuation Application of International Application PCT/JP98/05226 which was filed on Nov. 19, 1998 claiming the conventional priority of Japanese patent application No. 9-319239 filed on Nov. 20, 1997.

BACKGROUND OF THE INVENTION

1. Field of the Invention

The present invention relates to a mark detection method and a mark position detector which are suitable for detecting a mark position of an alignment mark formed on a substrate such as a wafer, to which a mask pattern is transferred, in a lithographic process for making a semiconductor device, a liquid crystal display element, a thin-film magnetic head or the like.

2. Description of the Related Art

In making semiconductor devices etc. in the past, the reductive projection and batch exposure type of projection exposure apparatus (stepper) was often used to transfer a pattern on a reticle as a mask to each shot area on a wafer (or a glass plate or the like) as a substrate which is coated with photoresist. Recently, the scanning exposure type of projection exposure apparatus, too, has come into use, which may be the step-and-scan system for exposure with a reticle and a wafer moved synchronously at a speed ratio which is substantially the magnifying power of projection.

In general, a semiconductor device is formed with minute patterns stacked in several tens of layers in predetermined positional relationship with each other on a wafer. Therefore, in order to align a reticle pattern for exposure precisely with the circuit pattern or patterns formed already on the wafer, the projection exposure apparatus is provided with an alignment sensor for detecting the position of an alignment mark (wafer mark) formed together with the circuit pattern or patterns on the wafer.

Various systems are known as alignment sensors. As an alignment sensor for highly accurate position detection, the grating alignment system is used, which radiates laser light over almost the whole area of an alignment mark in the form of a grating and receives the diffracted light from it. The alignment mark is formed as a brightness grating or a recess/protrusion grating in the previous processes of exposure, film formation and etching. In the past, the wavelength of the laser light used for the grating alignment system was set in a wavelength band of approximately 550–780 nm, by which the photosensitive material such as photoresist on a wafer was not be exposed.

By the way, in order to form minute circuit patterns more precisely, as semiconductor integrated circuits have been more miniaturized or minute, flattening processes have been adopted which involve flattening the outer surfaces of the layers formed on wafers. A typical example of the flattening processes is the CMP (chemical and mechanical polishing) process for polishing the outer surfaces of formed films to make them almost completely flat. The CMP process has often been applied to the interlayer insulation films (dielectrics such as silicon dioxide) between the wiring layers (metal) of semiconductor integrated circuits. In such a case, because a flattened interlayer insulation film transmits a beam of light with a wavelength of approximately 550–780 nm, and the beam reaches the alignment marks on the layer under the film, it has been possible to use alignment sensors on the conventional grating alignment system.

In this connection, the STI (shallow trench isolation) process has recently been developed, which includes a step of forming shallow trenches or grooves of predetermined width in a layer to isolate or insulate, for example, a minute element from an adjacent minute element thereto, and the step of embedding dielectrics or other insulators in the trenches. The STI process may also include a step of flattening by the CMP process the outer surface of the layer in which the insulators have been embedded, and forming a polysilicon film on the flattened surface. In this case, no recesses nor protrusions corresponding to the alignment marks of the layer under the polysilicon layer are formed in the outer surface of the polysilicon layer. A polysilicon layer does not transmit any beams of light with a wavelength of 550–780 nm (visible light). Consequently, the sensor with the conventional grating alignment system was not able to detect an alignment mark formed in the layer under the polysilicon layer. Therefore, there has been need for an alignment sensor which can precisely detect through a polysilicon layer etc., for example, on the grating alignment system, the position of a flat alignment mark formed particularly by the STI process.

In view of the foregoing points, an object of the present invention is to provide a mark detection method and a position detector which allow precise detection of the position of a flattened alignment mark even if the mark is formed at the bottom of a film which transmits no visible light.

Another object of the invention is to provide an exposure apparatus provided with such a mark position detector.

A further object of the invention is to provide an exposure method and a method of making a semiconductor device which allow accurate alignment by using the mark detection method.

SUMMARY OF THE INVENTION

A mark detection method according to the present invention is a method for detecting the position of an alignment mark (26) formed on a substrate (4), to align the substrate (4) with a mask pattern (R) in superposing the pattern (R) on and transferring it onto the substrate (4), on which the mark (26) is formed together with a predetermined pattern (29). The method includes the step of irradiating the mark (26) with one coherent light beam (L2) or two mutually coherent light beams (LA and LB) having a wavelength between 800 and 1500 nm, the step of receiving diffracted light (LDA, LDB or LD) produced from the mark (26), and the step of detecting the position of the mark (26) on the basis of the received diffracted light.

The alignment mark (26) may be a mark in the form of a diffraction grating formed by the STI (shallow trench isolation) process, as an example. In this case, the outer surface of the mark is flattened by the CMP (chemical and mechanical polishing) process. The flattened surface is coated with polysilicon (Si) or other thin film which is highly absorptive for visible light, but which well transmits infrared light. Because the outer surface of the thin film is flat, it is impossible to detect the mark (26) through the recesses or protrusions of this surface. However, because the wavelength of the beam or beams used for the present invention is 800 or more nm, the thin film transmits the beam or beams, which can then reach the mark (26) under the film. This makes it possible to detect the position of the alignment mark.

The detection resolution is approximately proportional to the wavelength of the beam or beams. However, because the wavelength is 1500 or less nm, the accuracy of detection is very high.

As an example, the alignment mark (26) may be irradiated with two mutually coherent light beams (LA and LB). The irradiation produces a pair of diffracted light beams (LD) in the same direction from the alignment mark (26). The pair of diffracted beams (LD) may be received. This causes the position of the alignment mark (26) to be detected by the two-beam interference system. By making the coherent beams different in frequency by a predetermined value from each other, it is possible to detect the mark position with high resolution (with accuracy) on the heterodyne interference system even if the mark is stationary.

As another example, the alignment mark (26) may be irradiated with one coherent light beam (L2). The irradiation produces a pair of diffracted light beams (LDA and LDB) from the alignment mark (26) in different directions. The pair of diffracted beams (LDA and LDB) may be received. This causes the position of the alignment mark (26) to be detected on the system for radiating one beam.

The system for radiating one beam may include irradiating a predetermined diffraction grating (18) with the pair of diffracted beams (LDA and LDB) from the alignment mark (26) at a predetermined intersectional angle, and detecting the position of the mark from the photoelectrically converted signal of diffracted light (LDC) produced from the grating (18). It is possible to detect the mark position with high resolution and accuracy from the phase of the photoelectrically converted signal.

Alternatively, this system may include irradiating a predetermined monitoring plane with the pair of diffracted beams (LDA and LDB) from the alignment mark (26) at a predetermined intersectional angle of intersection to form an image of interference fringes (20), and detecting the position of the mark on the basis of the intensity distribution of the image. It is possible to detect the mark position with high accuracy from the position (phase) of the fringe image.

The one coherent beam or two mutually coherent beams may further include a light beam or light beams, respectively, having a wavelength between 500 and 800 nm. This makes it possible to easily and accurately detect the position of the mark covered with a film which transmits visible light. The wavelength ranges between 630 and 800 nm of the beam or beams is preferable, because this range makes a high-output light source easily available, and does not make a sensitive material such as photoresist exposed.

A mark position detector according to the present invention is provided in an exposure apparatus for superposing a mask pattern (R) on and transferring it onto a substrate (4) on which an alignment mark (26) is formed together with a predetermined pattern (29). The mark position detector detects the position of the alignment mark (26) on the substrate to align the substrate and the mask pattern with each other. The mark position detector includes an irradiating optical system (10, 11, 14, 15 and PL, or 10–13, 15 and PL) for irradiating the alignment mark (26) with one coherent light beam (L2) or two mutually coherent light beams (LA and LB) having a wavelength between 800 and 1500 nm, and a receiving optical system (PL, 15, 17, 18 and 16, or PL, 15 14 and 16) for receiving diffracted light produced from the mark (26). The mark position detector detects the position of the alignment mark (26) on the basis of the received diffracted light.

Because the beam or beams having the wavelength between 800 and 1500 nm are used for position detection, the mark detection method according to the present invention can be used for the mark position detector according to the invention. An exposure apparatus according to the present invention is provided with the mark position detector according to the invention.

A method of exposure according to the present invention for transferring a pattern on a mask (R) to a substrate (4) includes the step of irradiating an alignment mark (26) on the substrate with a coherent beam (LA, LB, L2) having a wavelength between 800 and 1500 nm, the step of receiving diffracted light (LD, LDA, LDB) produced from the alignment mark to detect positional information about the mark, and the step of adjusting the positional relationship between the mask and the substrate on the basis of the detected information. The mark detection method according to the invention is used in this method of exposure. Consequently, the method of exposure can perform accurate alignment with high accuracy of superposition even in the case of a flattened alignment mark formed at the bottom of a film which does not transmit visible light.

In this case, the alignment mark may include an insulator (25d) embedded in a recess by the STI process, or may be covered with a polysilicon film (27).

If the coherent beam has two beams (LA and LB), accurate alignment can be performed by the heterodyne interference system or the homodyne interference system.

If the coherent beam has one beam (L2), it is possible to perform position detection with simple structure by irradiating a reference grating (18) with light produced from the alignment mark by the irradiation with the beam, and receiving a pair of diffracted light beams (LDC) produced from the reference grating. With an alignment mark on the mask (R) used as a reference grating, alignment may be performed by the TTR system.

The coherent beam may have multiple wavelength and include at least a first coherent beam having a wavelength between 800 and 1500 nm and a second coherent beam different in wavelength from the first beam. The second beam may have a wavelength between 500 and 1500 nm or between 500 and 800 nm.

A method for making a semiconductor device according to the present invention includes the step of forming a plurality of patterns superposed on a substrate (4). This method comprises the step of irradiating an alignment mark (26) on the substrate with a coherent beam having a wavelength between 800 and 1500 nm, the step of receiving diffracted light produced from the alignment mark to detect positional information about the mark, and the step of transferring the predetermined mask pattern onto the substrate so that the predetermined mask pattern is superposed on the mask pattern, on the basis of the detected information. Since the mark detection method according to the invention is used in this method for making a semiconductor, high accuracy of superposition is achieved even if the alignment mark is formed at the bottom of a film (which may be made of polysilicon) which transmits no visible light. It is consequently possible to make high-performance semiconductor devices at a high throughput by this method.

The step of transferring the mask pattern onto the substrate may be preceded by the step of embedding insulators (25c and 25d) in respective recesses for the pattern and the alignment mark on the substrate. Even if flattening has been performed by the CMP process, high accuracy of superposition can be obtained. The method of transfer may be either the step-and-repeat system (batch exposure type) or the step-and-scan system (scanning exposure type).

DESCRIPTION OF THE PREFERRED EMBODIMENT

Figure 1:
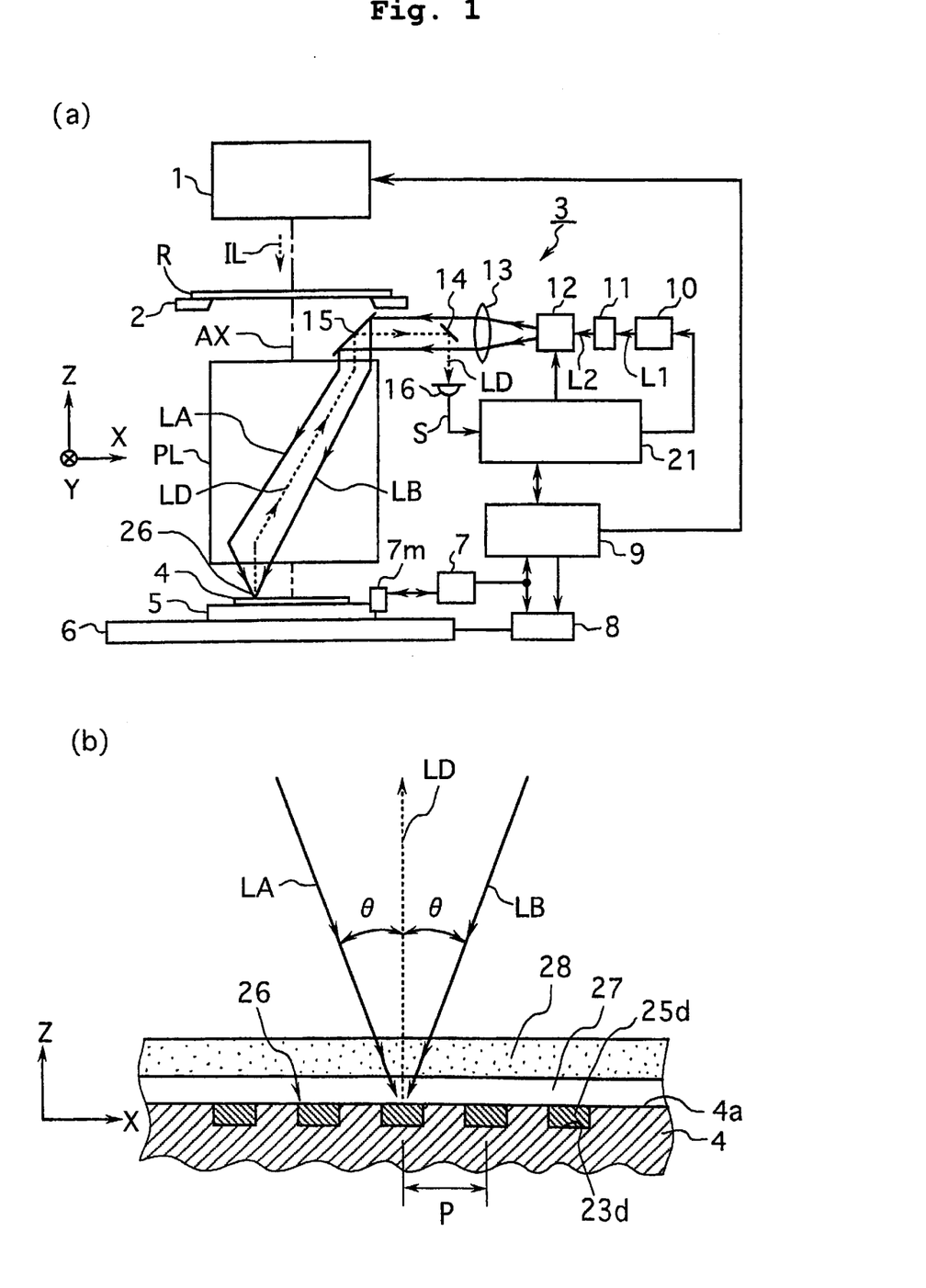
FIGS. 1(a)–1(b) is a schematic diagram showing the projection exposure apparatus used for a first embodiment of the present invention and FIG. 1(b) an enlarged sectional view showing the alignment mark 26 shown in FIG. 1(a).

A first preferred embodiment of the present invention will be described below with reference to FIG. 1. This embodiment is an application of the invention to the alignment sensor on the TTL (through-the-lens) system and the grating alignment system which is fitted to a projection exposure apparatus. FIG. 1(a) shows the projection exposure apparatus, which includes an illuminating optical system 1. The optical system 1 includes an exposure light source, an optical integrator (homogenizer) for homogenization of illuminance distribution, a relay lens, a variable field stop, a condenser lens, etc. In the process of exposure, the optical system 1 emits or radiates illuminating light IL for exposure to illuminate a predetermined illumination area on the (bottom) pattern surface of a reticle R. The light source may be a KrF (wavelength of 248 nm), ArF (wavelength of 193 nm) or $F_2$ (wavelength of 157 nm) excimer laser source, or a mercury lamp.

A projection optical system PL is telecentric on both sides (or the wafer's side only). The pattern image in the illumination area of the reticle R is reduced through the optical system PL at a magnifying power of projection β (¼ or ⅕ magnification). The reduced image is projected onto each shot area on a wafer 4 coated with photoresist. Description will be made hereinafter with a Z-axis parallel to the optical axis AX of the optical system PL, an X-axis on a plane perpendicular to the Z-axis and parallel to the plane of FIG. 1(a), and a Y-axis perpendicular to this plane.

The reticle R is held with suction on a reticle stage 2, which positions the reticle R in the directions X and Y and the rotational directions. A laser interferometer (not shown) measures the position of the reticle stage 2. A main control system 9 generally controls the operation of the whole apparatus and outputs control information. On the basis of the measured stage position and the output control information, a reticle stage drive system (not shown) controls the operation of the reticle stage 2.

The wafer 4 is held with adsorption on a wafer holder (not shown), which is fixed on a workpiece table 5. The workpiece table 5 controls the focusing position (in the directions Z) and the angle of inclination of the wafer 4. The workpiece table 5 is fixed on a wafer stage 6, which positions it in the directions X and Y. The workpiece table 5 supports a moving mirror 7m on its top. The moving mirror 7m and the associated laser interferometer 7 measure the two-dimensional position of the workpiece table 5 (wafer 4). On the basis of the measured table position and the control information from the main control system 9, a wafer stage drive system 8 controls the operation of the wafer stage 6, for example, on the linear motor system. The measured values from the laser interferometer 7 are also supplied to the control system 9.

If the projection exposure apparatus is of the batch exposure type (stepper type) like this embodiment, the illuminating light IL is radiated to expose each shot area on the wafer 4 through the pattern image on the reticle R, with the shot area to be exposed being stationary at the exposure area formed by the projection optical system PL. After the exposure, the wafer stage 6 steps (forward) to move the next shot area to the exposure area. In this way, the pattern image on the reticle R is transferred to the shot areas on the wafer 4 on the step-and-repeat system.

The present invention can also be applied to a projection exposure apparatus on the step-and-scan system. The reticle stage 2 of this apparatus can continuously move in predetermined directions (for example, Y-directions). In the process of scanning exposure, the reticle R of this apparatus and a wafer 4 are synchronously scanned with the reticle stage 2 and the wafer stage 6, respectively, of the apparatus with respect to the projection optical system PL at a speed ratio which is substantially the magnifying power of projection β.

Before sequentially transferring the pattern image of the reticle R onto the respective shot areas on the wafer 4, it is necessary to align the reticle and the shot areas. For this purpose, the reticle R has an alignment mark formed near its pattern area, and offset between the alignment mark and the reference mark (not shown) on the workpiece table 5 is detected by a reticle alignment microscope (not shown) provided above the reticle R. The detection enables an image or the pattern on the reticle R to be aligned with the wafer stage 6. The wafer 4 has alignment marks (wafer marks) formed in the respective shot areas thereof. Positioned on one side of the projection optical system PL is an alignment sensor 3 which employs the TTL system and the grating alignment system and detects the positions of the alignment marks.

The distance (base line amount) between the center of the pattern image on the reticle R and the center of detection of the alignment sensor 3 is determined in advance with the reference mark (not shown) on the workpiece table 5, and stored in the main control system 9. In the process of wafer alignment, the alignment sensor 3 may detect the position of the alignment mark in the shot area for exposure, and this shot area may, on the basis of the result of the detection and the base line amount, be moved to the exposure position to be exposed through the pattern image on the reticle R. This results in accurate superposition exposure. Hereinafter, description will be made on the assumption that the mark to be detected is an alignment mark 26 along the X-axis.

FIG. 1(b) is an enlarged section showing the alignment mark 26. As shown in FIG. 1(b), the wafer 4 includes a silicon substrate having recesses 23d formed in a surface thereof at a pitch P in the directions X by the STI (shallow trench isolation) process. Embedded in each recess 23d is an insulator 25d made of dielectric such as a silicon dioxide ($SiO_2$). Because the insulators 25d in the recesses 23d transmit infrared light etc. to some extent, the alignment mark 26 can be considered as a diffraction grating of the phase type (recesses/protrusions) formed with the pitch P in the directions X. If the insulators 25d hardly transmitted infrared light etc., it might be possible to consider the alignment mark 26 to be a diffraction grating of the amplitude type with the pitch P which utilizes the difference in reflectance (factor) between the substrate of the wafer 4 and the insulators 25d.

When the wafer 4 is subjected to the STI process, the surface 4a of the wafer 4, inclusive of the outer surface of the alignment mark 26, is flattened by the CMP (chemical and mechanical polishing) process. A polysilicon film (Si) 27 is formed on the surface 4a. The polysilicon film 27 hardly transmits visible light, but has a transmittance at least to such a degree that it is possible to detect the transmitted infrared light having a wavelength of 800 or more nm. Because the surface 4a, inclusive of the alignment mark 26, is well flattened by the CMP process, no recesses resulting from the recesses 23d for the mark appear in the outer surface of the polysilicon film 27 on the surface 4a. The polysilicon film 27 is coated with photoresist 28 as photosensitive material. Because the sensitivity of the photoresist 28 is sensitive the ultraviolet wavelength region which is less than a wavelength of approximately 400 nm, the photoresist transmits most of infrared light and visible light which comes into the photoresist substantially perpendicular thereto. In other words, neither infrared light nor visible light exposes the photoresist 28.

With reference to FIG. 1(a), the alignment sensor 3 includes a laser source 10 such as a semiconductor laser or a YAG laser. In the process of alignment, the laser source 10 emits or radiates a coherent laser beam L1. The beam L1 has a wavelength which is within a range between 800 and 1,500 nm and can be considered monochromatic. The sectional form etc. of the laser beam L1 are shaped by a shaping optical system 11. The shaped beam is incident on a frequency shifter 12 including an acousto-optical element or device (AMO). The frequency shifter 12 produces two beams of light LA and LB slightly different in frequency from each other. The frequency difference is $\Delta f$. The mutually coherent beams LA and LB are incident on the projection optical system PL via a relay lens 13 and an optical path angling mirror 15, which is positioned between the reticle R and this optical system PL. After passing through the optical system PL, the beams LA and LB are incident on the alignment mark 26 on the wafer 4 at a predetermined angle of intersection in the directions X.

As described with reference to FIG. 1(b), the polysilicon film 27 and the photoresist 28 are formed on or over the alignment mark 26. The wavelengths of the beams LA and LB are 800 or more nm. Therefore, without exposing the photoresist 28, the beams LA and LB are transmitted by the polysilicon film 27 at a considerable transmittance and reach the alignment mark 26. In this respect, the detection wavelength of a sensor on the conventional grating alignment system is approx. 550–780 nm. If that sensor was used in place of the sensor 3, it would be difficult to detect the alignment mark 26 with the beams transmitted by the polysilicon film 27 on the mark.

P is the pitch of the alignment mark 26 in the direction X. $\lambda$ is the wavelength of the beams LA and LB. The angle of incidence $\theta$ of the beams LA and LB on the alignment mark 26 in the directions X is so set as to satisfy the following expression:

$$\sin \theta = \lambda/P \quad (1)$$

This produces a beam of plus primary (+1) diffracted light of the beam LA and a beam of minus primary (−1) diffracted light of the beam LB vertically upward (in a midway direction between the directions of incidence of the beams LA, LB) in parallel from the alignment mark 26. The pair of primary diffracted light beams are heterodyne beams varying in intensity at a frequency $\Delta f$. The heterodyne beams will be referred to as the beams of diffracted light LD. The beams of diffracted light LD, which are produced from the alignment mark 26, are received via the projection optical system PL, the mirror 15 and a branching mirror 14 by a photoelectric detector 16. The photoelectric detector 16 outputs a sinusoidal beat signal S at the frequency $\Delta f$, which is supplied to an alignment signal processing system 21. The alignment sensor 3 consists of laser source 10—photoelectric detector 16.

The alignment signal processing system 21 controls the timing of the light emission from the laser source 10 under the control of the main control system 9, and detects the phase of the beat signal S from the photoelectric detector 16. Because the phase of the beat signal S varies with the position of the alignment mark 26 along the X-axis, the processing system 21 detects the position accurately from the phase, and supplies the result of the detection to the control system 9. For example, Japanese Patent Application Laid-Open No. 2-283011 and U.S. Pat. No. 5,151,750 corresponding thereto disclose detailed structure of an alignment sensor which is similar in structure to the sensor 3, but of which the detection light has a different wavelength band. The content of these patent documents are incorporated herein by reference.

This embodiment is based on the heterodyne system which makes the frequency difference $\Delta f$ between the beams LA and LB. Therefore, the alignment signal processing system 21 detects the phase difference between the beat signal S and a reference signal which is equal in frequency to the frequency difference $\Delta f$. The processing system 21 also detects the position of the alignment mark 26 on the basis of this phase difference and the value(s) measured by the laser interferometer 7 when the mark is detected. The reference signal may be a drive signal for the frequency shifter 12. Alternatively, a beam splitter (not shown) may be provided between the relay lens 13 and the mirror 15 to branch parts of the beams LA and LB. The branched parts may be radiated onto a reference grating, which produces heterodyne beams consisting of plus primary diffracted light and minus primary diffracted light. The heterodyne beams may be photoelectrically detected so that their reference signal may be obtained. Because such position detection algorithm is well known, it will not be described further.

The projection exposure apparatus also includes a Y-axis alignment sensor (not shown) for detecting the position of an alignment mark along the Y-axis. This alignment sensor is provided in parallel to the alignment sensor 3. The main control system 9 is also supplied with the information provided by this sensor on the mark position along the Y-axis as well. On the basis of the positions of the alignment marks along the X-axis and Y-axis, the information on the positional relationship between each mark and the center of the shot area where the mark exists, and the base line amount explained already, the control system 9 determines the position to which the wafer 4 is moved. The information on the determined position is supplied to the wafer stage drive system 8. In accordance with the supplied information, the wafer stage 6 moves the wafer 4 (workpiece table 5) to the exposure position. Upon completion of the positioning (alignment), exposure is performed with the pattern image of the reticle R.

Thus, the alignment mark 26 can be irradiated with the beams LA and LB, which have wavelengths of 800 or more nm. Therefore, although the alignment mark 26 is covered with the polysilicon film 27, the film transmits the beams LA and LB. Consequently, the position of the alignment mark 26 can be detected with high resolution on the heterodyne interference system. Because the wavelengths of the beams LA and LB are 1500 or less nm, the accuracy of detection is high.

Because this embodiment is based on the heterodyne interference system, the two beams LA and LB radiated onto the alignment mark 26 differ slightly in frequency. Consequently, with the alignment mark 26 stationary, its position can be detected accurately. Alternatively, the embodiment might be based on the homodyne interference system, which would keep the beams LA and LB equal in frequency. In this case, in order that the phases of the diffracted light beams LD could be detected, the alignment mark 26 might be scanned along the X-axis through the wafer stage 6.

The alignment sensor 3 is based on the TTL system, which detects the mark through the projection optical system PL. The present invention can also be applied to an alignment sensor on the TTR (through the reticle) system. As disclosed in Japanese Patent Application Laid-Open No. 6-260389 and U.S. patent application Ser. No. 08/198,077 corresponding thereto, the TTR system radiates two beams onto an alignment mark on a reticle R and two beams onto an alignment mark on a wafer 4, independently photoelectrically detect the interference light consisting of plus primary (+1) diffracted light and minus primary (−1) diffracted light produced from each of the marks, and find the quantity of misalignment or displacement between the marks from the phase difference between the two detected signals. The contents of Japanese Patent Application Laid-Open No. 6-260389 and U.S. patent application Ser. No. 08/198,077 corresponding thereto are incorporated herein by reference.

The chromatic aberration of the projection optical system PL is well corrected for the exposure wavelength (for example, 248 or 193 nm). Accordingly, in the case of the alignment sensor on the TTR system used, it is preferable that, in such a manner that the alignment mark on the wafer 4 is irradiated with the two beams (in this embodiment, coherent light having an oscillation spectrum between the wavelengths of 800 and 1500 nm) passing through a window formed through the reticle R and the optical system PL, and that the beams of primary (±1) diffracted light produced from the mark pass through this optical system and the window, a correcting plate including correcting optical elements (which may be diffraction gratings) for deflecting the two beams and the beams of primary (±1) diffracted light should be provided on the pupil plane of the projection optical system PL.

The alignment sensor 3 might otherwise be based on the off-axis system as is the sensor disclosed, for example, in Japanese Patent Application Laid-Open No. 7-321030 and U.S. Pat. No. 5,721,605 corresponding thereto, the contents of which are incorporated herein by reference. The off-axis system would radiate two beams of light onto the alignment mark on the wafer 4 through an objective optical system, which might be provided separately from the projection optical system PL.

Whichever of the TTL system (FIG. 1(a)), the TTR system and the off-axis system the alignment sensor 3 is based on, it may be adapted to detect the alignment mark with pairs of beams which differ in wavelength. The pairs include a first pair of beams and a second pair of beams. It is preferable that the first pair be beams of first monochromatic light having a wavelength between 800 and 1500 nm while the second pair be beams of second monochromatic light having a wavelength between 500 and 800 nm (for example, 633 or 544 nm). If the alignment mark can be detected with the first and second pairs of beams, it is possible to find the position of the mark accurately by using one of the mark positions detected with the respective pairs of beams by the alignment signal processing system 21, the average of them, or a weighted average which is each detected value (mark position) weighted depending on predetermined reliability (for example, the amplitude of each beat signal).

The first pair of beams is used to find the positions of alignment marks which can be detected with only one of the first and second pairs of beams. These marks are exemplified by the alignment marks of this embodiment, in which insulators are embedded by the STI process, and in which a polysilicon film is formed on the outer surfaces of the embedded insulators. This makes it possible to use the optimum alignment light for each layer, greatly reducing the influence of thin-film interference in the photoresist or the like. It is consequently possible to improve the accuracy of alignment mark detection.

The wavelength of the second monochromatic light for use as the second pair of beams is not limited to the range between 500 and 800 nm. The second monochromatic light may have any wavelength between 800 and 1500 nm which differs from that of the first monochromatic light. The pairs of beams for alignment mark detection are not limited to two pairs, but may be three or more pairs different in wavelength from each other. The frequency difference between the beams of each pair may differ slightly from that of the other or those of the others. In the case of the alignment mark irradiated with pairs of beams which differ in wavelength, one photoelectric detector may be provided for each pair, and the optical system of the alignment sensor 3 may be used in common, or otherwise one optical system may be provided for each pair. Even in the case of the alignment sensor based on the homodyne interference system, two or more pairs of beams which differ in wavelength may likewise be used.

Figure 4:
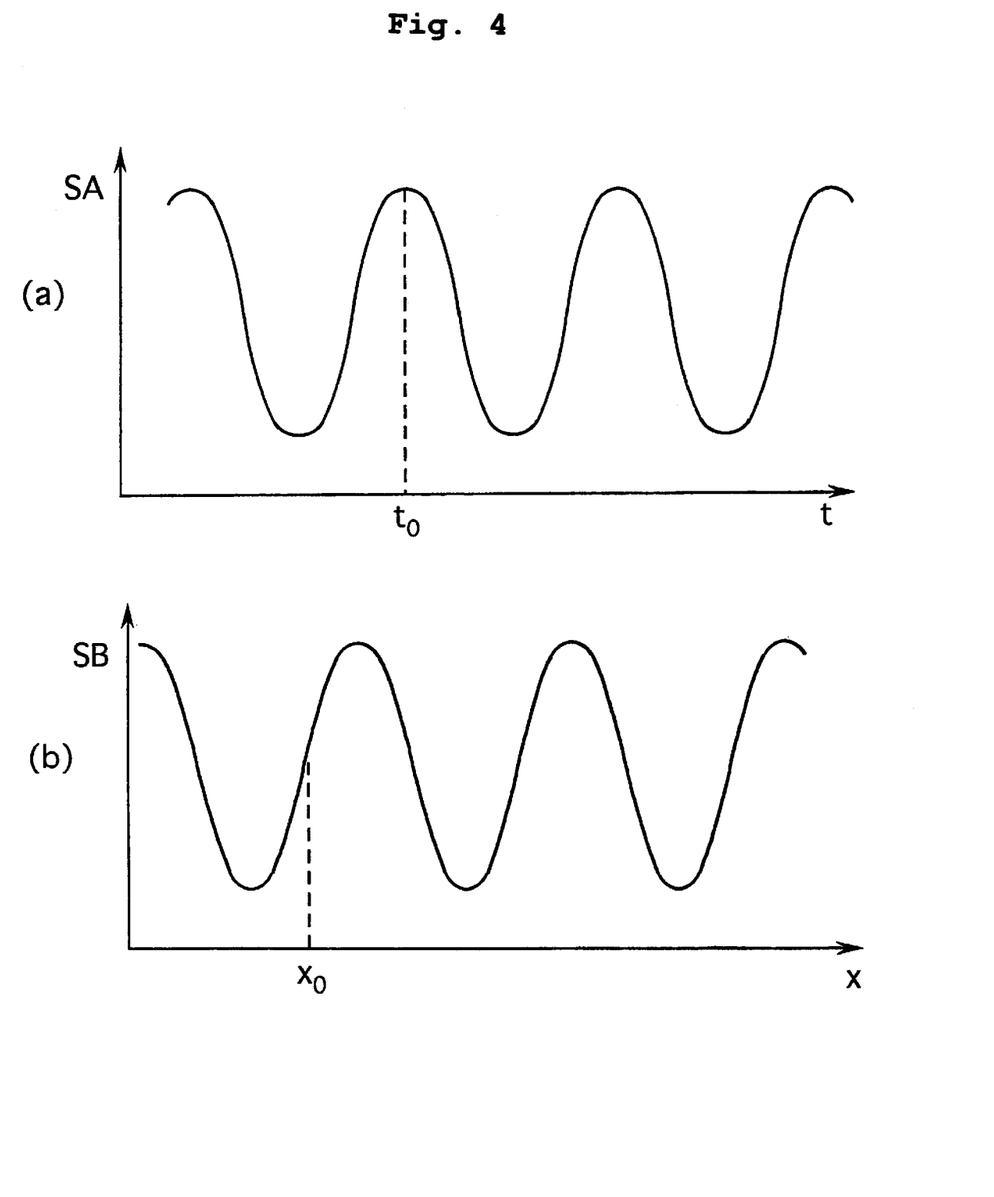
FIGS. 4(a) and 4(b) show a detected signal SA output from the photoelectric detector 16 shown in FIG. 2 and an image pickup signal SB output from the pickup device shown in FIG. 3.

A second embodiment of the present invention will be described below with reference to FIGS. 2 and 4. This embodiment is another application of the present invention to an alignment sensor on the grating alignment system. The alignment sensor of this embodiment differs in irradiating the alignment mark with one beam of light, and detecting the two beams of diffracted light produced from the mark in different directions.

Figure 2:
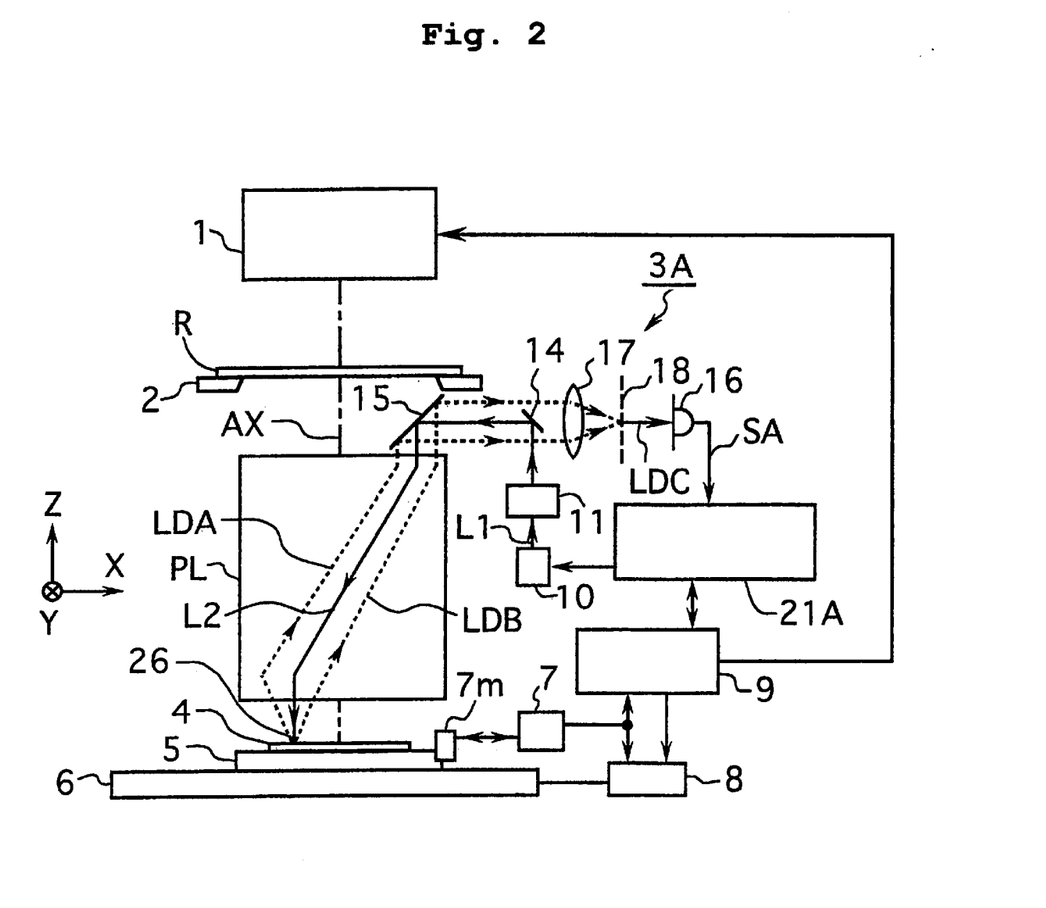
FIG. 2 is a schematic diagram showing the projection exposure apparatus used for a second embodiment of the present invention.

FIG. 2 shows the projection exposure apparatus of this embodiment. In FIGS. 1 and 2, the counterparts are assigned the same reference numerals. With reference to FIG. 2, the alignment sensor 3A is positioned on one side of a projection optical system PL, and based on the TTL system and the grating alignment system. The alignment sensor 3A includes a laser source 1, which emits a monochromatic laser beam L1 having a wavelength between 800 and 1500 nm. A shaping optical system 11 converts the beam L1 into a beam L2 of predetermined sectional form. The beam L2 is radiated onto an alignment mark 26 on a wafer 4 via a branching mirror 14, an optical path angling mirror 15 and the optical system PL. As is the case with the first embodiment, the alignment mark 26 takes the form of a diffraction grating, and includes insulators embedded in recesses and flattened. The alignment mark 26 is covered with polysilicon film and photoresist.

P is the pitch of the alignment mark 26. λ is the wavelength of the beam L2. When the beam L2 is incident on the alignment mark 26, a beam of plus primary (+1) diffracted light LDA and a beam of minus primary (−1) diffracted light LDB are produced in symmetry from the mark at the angle of diffraction ±θ which can be found from the following expression:

$$\sin \theta = \lambda/P \qquad (2)$$

The beams of diffracted light LDA and LDB pass via the projection optical system PL and the mirror 15 to a condensing lens 17, which condenses them at a predetermined angle of intersection on a reference grating 18. The condensed beams form interference fringes on the reference grating 18. This grating 18 is a diffraction grating of the amplitude type, which has transmitting and shielding areas formed periodically at the same pitch as the intensity distribution of the interference fringes on the grating. The plus primary (+1) diffracted light beam of the diffracted light beam LDA and the minus primary (−1) diffracted light beam of the diffracted light beam LDB are produced as beams of interference light LDC in parallel from the reference grating 18. The beams of interference light LDC are received by a photoelectric detector 16, which outputs a detected signal SA to an alignment signal processing system 21A. The alignment sensor 3A is constituted of the laser source 10, the shaping optical system 11 and the branching mirror 14, the condensing lens 17, the reference grating 18, and the photoelectric detector 16.

The alignment signal processing system 21A controls the timing of the light emission from the laser source 10 under the control of a main control system 9, and detects the position of the alignment mark 26 from the detected signal SA. That is to say, the position of the interference fringes on the reference grating 18 reflects the position of the alignment mark 26. The phase of the detected signal SA varies with the fringe position. Accordingly, in the process of alignment, the control system 9 may, by way of example, drive the wafer stage 6 in the directions X to scan the alignment mark 26 relative to the beam L2. This, as shown in FIG. 4(a), makes the detected signal SA change sinusoidally as time t passes. The processing system 21A detects the phase of the detected signal SA at a predetermined point of time $t_0$ to detect the position of the alignment mark 26. Because the wavelength of the beam L2 ranges between 800 and 1500 nm, the beam is transmitted by the polysilicon film covering the alignment mark 26. This makes it possible to accurately detect the position of the alignment mark 26.

In place of the wafer stage 6, the reference grating might be scanned or vibrated. This, too, can change the intensity of the beams received by the photoelectric detector 16. As a result, the position of the alignment mark 26 can be detected.

Figure 3:
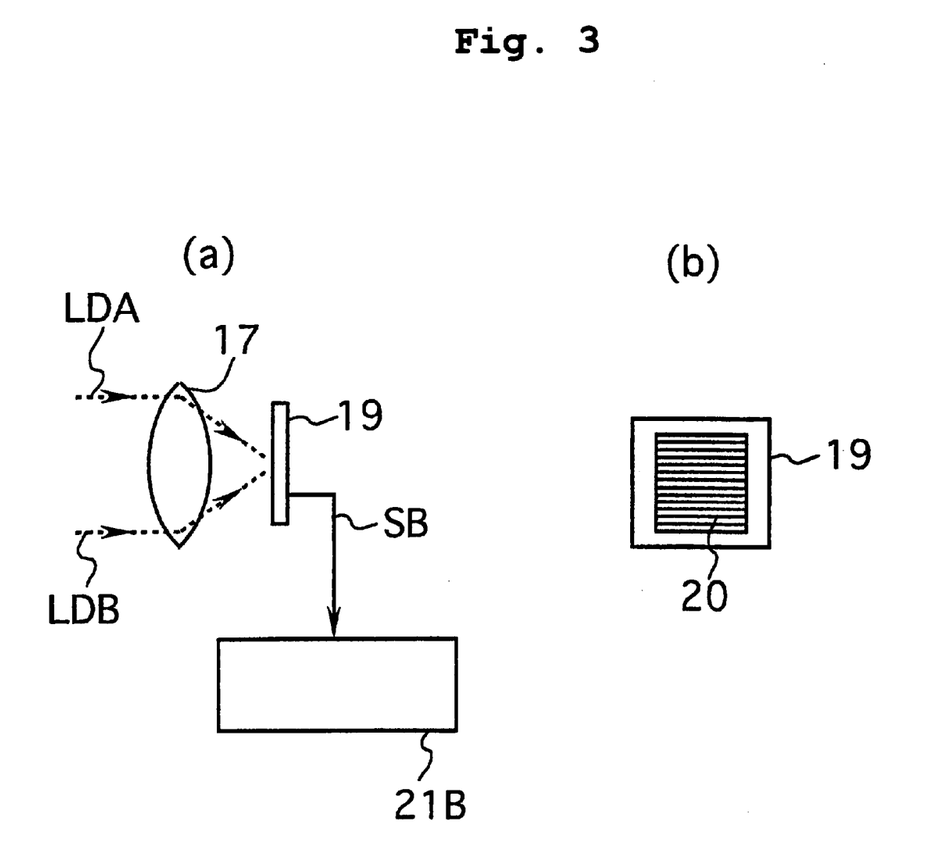
FIGS. 3a–3b show main parts of the alignment sensor of a third embodiment of the present invention and the interference fringes formed on the image pickup device in the sensor.

A third embodiment of the present invention will be described below with reference to FIG. 3. This embodiment includes an image pickup device 19 (FIG. 3(a)) in place of the reference grating 18 and the photoelectric detector 16 of the second embodiment shown in FIG. 2, but otherwise the optical systems of these embodiments are the same. The pickup device 19 is two-dimensional and may be a CCD. With reference to FIGS. 2 and 3(a), the beams of diffracted light LDA and LDB from the alignment mark 26 are condensed by the condensing lens 17 on the image pickup plane or surface of the pickup device 19. As shown in FIG. 3(b), the condensed beams form interference fringes 20 on the pickup plane. The interference fringes 20 are identical with the fringes on the reference grating 18 shown in FIG. 2. The pickup device 19 supplies an image pickup signal SB to an alignment signal processing system 21B, which detects the position (phase) of the interference fringes 20 from this signal. The image pickup signal SB is sinusoidal as shown in FIG. 4(b), where the horizontal axis represents the positions x on the image pickup device 19 in the direction corresponding to the direction (X) of measurement of the alignment mark 26, not time t. The alignment signal processing system 21B detects the phase of the pickup signal SB at a predetermined reference point $x_0$ on the image pickup plane to detect the position of the alignment mark 26. This embodiment makes it possible to accurately detect the position of the alignment mark 26, with beams transmitted by the polysilicon film covering the mark.

The optical system of the alignment sensor of each of the second and third embodiments is the TTL system, where the projection optical system is used as part of the optical system of the sensor. Alternatively, the optical system of the alignment sensor might be the off-axis system completely independent from the projection optical system PL. In the case of the off-axis system, it is possible to use an objective lens having an independently corrected aberration. Accordingly, the detection [or detecting] beams may be combinations of monochromatic light beams having wavelengths between 800 and 1500 nm, or multi-wavelength beams. This may reduce the influence of thin-film interference in the photoresist layer or the like on a wafer.

Instead, the detection beams may be combinations of a first monochromatic light beam having a wavelength between 800 and 1500 nm and a second monochromatic light beam having a wavelength between 500 and 800 nm. Otherwise, the alignment sensor 3A might be combined with an alignment sensor on the conventional grating alignment system which uses beams having a wavelength between 500 and 800 nm. The second monochromatic light beam may have a wavelength between 630 and 800 nm. If the wavelength is 630 or more nm, the position of the alignment mark covered with a film which transmits normal or general visible light can be detected accurately at a high SN ratio with an He-Ne laser (having a wavelength of 633 nm), a red semiconductor laser or another high-output cheap light source.

Particularly, in the second embodiment shown in FIG. 2, the reference grating 18 might be formed on the reticle 2 so that the wafer 4 and the reticle R could be directly aligned with each other by the TTR (through the reticle) system.

Each of the above three embodiments is an application of the present invention to an alignment sensor on the grating alignment system. The invention may also be applied to an alignment sensor on the laser step alignment (LSA) system. This system detects the positions of alignment marks in dot line form (a type of diffraction grating) by relatively scanning a laser beam [or laser beams] condensed in slit form and the marks, and receiving the beams of diffracted light produced from the marks.

Figure 5:
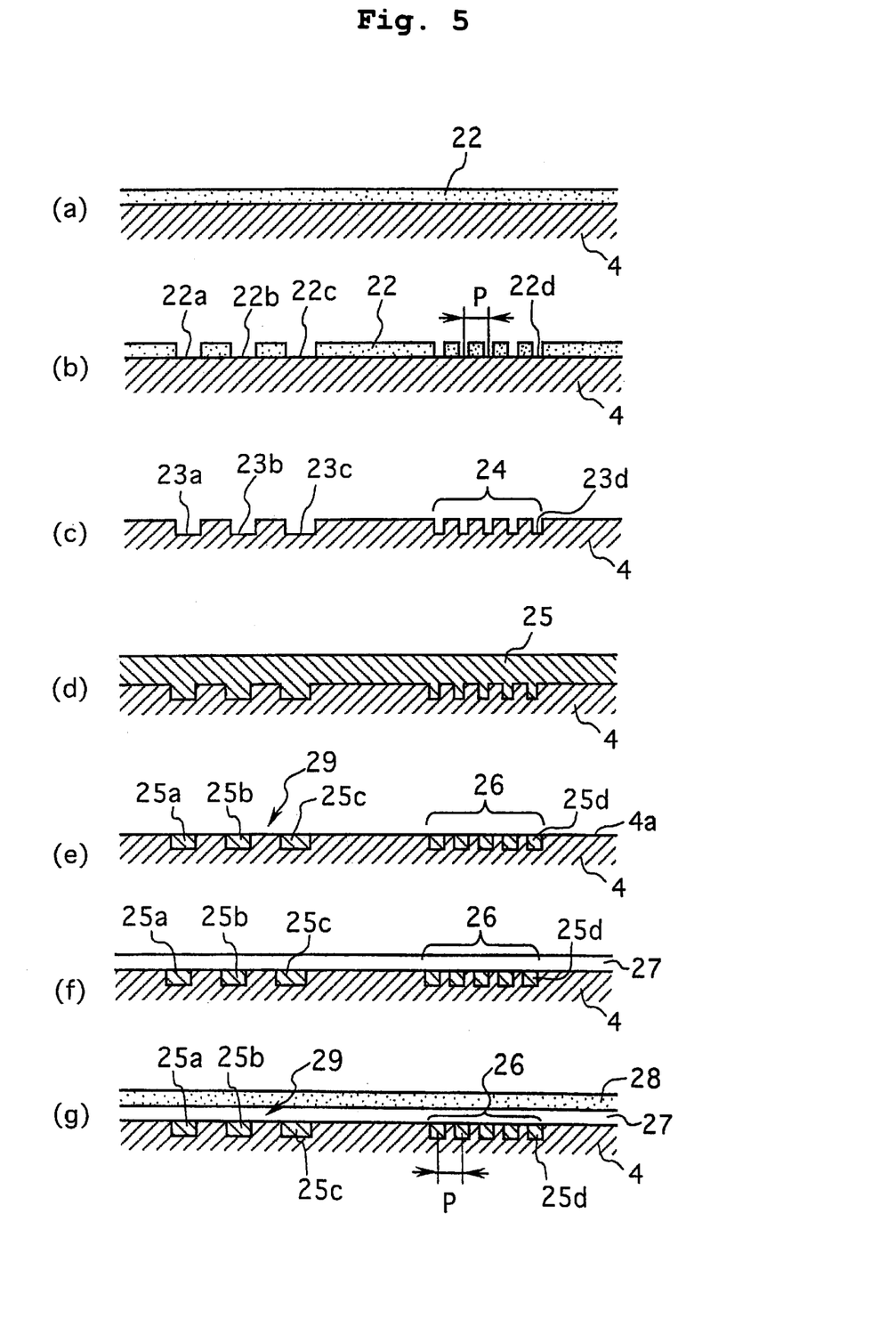
FIGS. 5(a)–5(g) show a method for forming an alignment mark to be detected with each of the embodiments.

FIG. 5 shows a method or process for forming alignment marks 26 to be detected in the foregoing embodiments.

[First Step]

First, as shown in FIG. 5(a), one surface of a wafer 4 which is a silicon substrate is coated with photoresist 22. Thereafter, the photoresist 22 is exposed through a reticle pattern image by an exposure apparatus. Thereafter, as shown in FIG. 5(b), the photoresist 22 is developed to have spaces 22a–22c of predetermined width formed in its portion corresponding to a circuit pattern area, and narrower spaces 22d formed at the pitch P (FIG. 1(b)) in its portion corresponding to the alignment marks.

[Second Step]

After the wafer 4 shown in FIG. 5(b) is etched through the photoresist 22 as a mask, the photoresist is removed. This, as shown in FIG. 5(c), forms recesses 23a–23c of the predetermined width in the circuit pattern area of the wafer 4 and narrower recesses 23d at the pitch P in the alignment mark area of the wafer.

[Third Step]

As shown in FIG. 5(d), an insulating film 25 made of dielectric such as silicon dioxide ($SiO_2$) is formed on the wafer 4. Thereafter, the outer surface of the insulating film 25 is processed by the CMP process so that, as shown in FIG. 5(e), the film is partially removed and flattened until the wafer surface 4a appears or is exposed. As a result, a circuit pattern 29 is formed in the form of insulators 25a–25c embedded in the wider recesses in the circuit pattern area of the wafer 4, while an alignment mark 26 is formed in the form of insulators 25d embedded in the recesses formed at the pitch P in the alignment mark area of the wafer. The first to third steps constitute the STI (shallow trench isolation) process. The insulators 25a–25c in the circuit pattern area 29 serve to insulate adjacent minute elements from each other. A predetermined minute circuit pattern is formed between the insulators 25a–25c, for example, at the step before or after this step.

[Fourth Step]

In such a case that gates are formed in a layer on or over the surface 4a of the wafer 4 shown in FIG. 5(e), a polysilicon film 27 is formed on this surface as shown in FIG. 5(f). Thereafter, in order that a predetermined circuit pattern may be formed in the polysilicon film 27, the outer surface of this film is coated with photoresist 28 as shown in FIG. 5(g). The alignment mark 26 at this stage is in the same condition as the mark 26 shown in FIG. 1(b) is. Thereafter, superposing exposure is performed, for example, by the projection exposure apparatus shown in FIG. 1.

As stated above, this method of mark formation makes it possible to form alignment marks 26 efficiently while forming a circuit pattern by the STI (shallow trench isolation) process. In FIG. 5, the alignment mark 26 is formed together with the circuit pattern 29 directly in the surface of the wafer 4. Alternatively, the wafer 4 might be stacked with layers, one of which might have recesses formed in it. Insulators or the like might be embedded in the recesses to form an alignment mark, to which the invention could be applied with similar effect.

Each of the exposure apparatus according to the embodiments may be replaced with an exposure apparatus employing the proximity system for exposure through the pattern on a mask with the mask and a substrate close or adjacent to each other without a projection optical system used. The present invention can also be applied to this case. The exposure apparatus are not limited to exposure apparatus for making semiconductors, but may be a variety of exposure apparatus such as liquid crystal exposure apparatus for exposing rectangular glass plates through liquid crystal display element patterns and exposure apparatus for making thin-film magnetic heads.

The exposure apparatus according to the embodiments may be exposure apparatus using X-rays or extreme ultraviolet (EUV) rays, such as soft X-rays, as exposure light, or electron beam exposure apparatus using electron beams as exposure beams.

In the case of a projection optical system used, its magnifying power may be any of reduction, one (equal) magnification and enlargement. If far ultraviolet rays such as excimer laser beams are used, the projection optical system is composed of quartz, fluorite or other material which transmits far ultraviolet rays. If $F_2$ laser beams or X-rays are used, the projection optical system is catadioptric or catoptric (with a reflecting reticle used). If electron beams are used, the optical systems may be electro-optical systems each consisting of an electron lens and a deflector. Of course, the optical paths through which electron beams pass are vacuum.

It is possible to produce the exposure apparatus according to each of the embodiments by incorporating an illuminating optical system, which consists of lenses, and a projection optical system into the apparatus body, making an optical adjustment, fitting the body with a reticle stage and a wafer stage, which consist of a large number of mechanical parts, connecting wires and pipes or tubes, and making a general adjustment (electric/al adjustment, operation confirmation, etc.). It is preferable that the exposure apparatus be produced in a clean room where the temperature and the cleanness are controlled.

It is possible to produce a semiconductor device by processing the wafer 4 shown in FIG. 1(a). The processing includes the step of designing the function and performance of the device, the step of producing a reticle on the basis of the designing step, the step of making a wafer out of silicon, the step of exposing the wafer through the pattern on the reticle while the wafer and the reticle are aligned by the associated exposure apparatus, the step of assembling the device (which includes dicing, bonding and packaging it), and the step of inspecting the product.

The present invention is not limited to the foregoing embodiments, which may of course be modified in various ways without departing from the spirit of the invention. The disclosure in the specification, claims, drawings and abstract of Japanese Patent Application No. 9-319239 filed on Nov. 20, 1997 has been incorporated completely herein by reference.

The mark detection method according to the present invention involves irradiating an alignment mark with one or more coherent light beams in a predetermined wavelength band. Consequently, even in the case of a flattened alignment mark formed at the bottom of a film (for example, a polysilicon layer) which transmits no visible light, it is possible to detect the position of the mark accurately with the beams transmitted through the film. Therefore, in the process of exposure, or of production of a semiconductor device, by aligning a substrate and a mask pattern with each other by this mark detection method, it is possible to obtain high accuracy of superposition. This makes it possible to produce high-performance semiconductor devices etc. at high yields.

It is possible to detect the position of this alignment mark accurately by means of the grating alignment system by irradiating the mark with two mutually coherent light beams or one coherent light beam, and receiving the pair of diffracted light beams produced from the mark.

If the alignment mark is irradiated with one coherent light beam, it is possible to detect the mark position accurately on a time base or a position base, respectively, by radiating the pair of diffracted light beams from the mark at a predetermined angle of intersection onto a predetermined diffraction grating, and detecting the photoelectrically converted signal of the diffracted light produced from this grating, or by radiating the pair of diffracted light beams from the mark at a predetermined angle of intersection onto a predetermined observation or monitoring plane or surface so as to form an image of interference fringes.

The position detector according to the present invention can be used by the mark detection method according to the invention. Even for exposure of a substrate which transmits no visible light, the exposure apparatus according to the invention can perform accurate alignment by means of the position detector.

What is claimed is:

1. A mark detection method for detecting an alignment mark having a recess in which an insulator is embedded formed on a substrate, the alignment mark being covered with a film which transmits no visible light comprising:

irradiating the alignment mark with a coherent light beam in an infrared wavelength band through the film;

receiving diffracted light produced from the alignment mark by the irradiation with the coherent beam; and detecting positional information about the alignment mark on the basis of the diffracted light.

2. The mark detection method according to claim 1, wherein the alignment mark is formed by an STI process.

3. The mark detection method according to claim 1, wherein the coherent beam includes a beam having a wavelength between 800 and 1500 nm.

4. The mark detection method according to claim 1, wherein the film includes polysilicon.

5. The mark detection method according to claim 1, wherein the alignment mark is irradiated with two mutually coherent light beams, and a pair of diffracted light beams produced in the same direction from the alignment mark by the irradiation with the coherent beams are received.

6. The mark detection method according to claim 1, wherein the alignment mark is irradiated with one coherent light beam, and a pair of diffracted light beams produced in different directions from the alignment mark are received.

7. The mark detection method according to claim 6, wherein a predetermined diffraction grating is irradiated with the pair of diffracted light beams from the alignment mark at a predetermined angle of intersection, and a position of the alignment mark is detected from a photoelectrically converted signal of diffracted light produced from the diffraction grating.

8. The mark detection method according to claim 5, wherein the two mutually coherent beams are heterodyne beams different in frequency from each other.

9. The mark detection method according to claim 1, wherein the coherent beam includes a first light beam having a first wavelength in the infrared wavelength band; and the alignment mark is irradiated with a second light beam having a second wavelength different from the first wavelength; and the diffracted light produced from the alignment mark by the irradiation with the second beam is received.

10. The mark detection method according to claim 9, wherein the second wavelength includes a wavelength in the infrared wavelength band.

11. The mark detection method according to claim 9, wherein the second wavelength includes a wavelength between 500 and 800 nm.

12. The mark detection method according to claim 9, wherein the first and second beams include a plurality of light beams which are substantially equal in wavelength to each other and mutually coherent, respectively.

13. The mark detection method according to claim 9, wherein the position of the alignment mark is detected on the basis of at least one of the diffracted light produced from the alignment mark by the irradiation with the first beam and the diffracted light produced from the alignment mark by the irradiation with the second beam.

14. A method of exposure for exposing a substrate with a predetermined pattern, comprising aligning the substrate with the predetermined pattern on the basis of positional information detected about the alignment mark by the mark detection method defined in claim 1.

15. The method of exposure according to claim 14, wherein the predetermined pattern is projected through a projection system onto the substrate and the diffracted light produced from the alignment mark is received through the projection system.

16. The method of exposure according to claim 15, wherein the predetermined pattern is formed on a mask, and the diffracted light produced from the alignment mark is received through the projection system and the mask.

17. The method of exposure according to claim 14, wherein the predetermined pattern is projected through a projection system onto the substrate, and the diffracted light produced from the alignment mark is received without being passed through the projection system.

18. A method of device production for producing a device via a process for transferring a predetermined pattern by superposing the predetermined pattern through a projection system on a pattern formed on a substrate, using the method of exposure defined in claim 14.

19. A mark detector which detects an alignment mark formed on a substrate, the alignment mark having a recess in which an insulator is embedded and being covered with a film which transmits substantially no visible light comprising:

an irradiating system which irradiates the alignment mark with a coherent light beam in an infrared wavelength band through the film; and a receiving system which receives diffracted light produced from the alignment mark by the irradiation with the coherent beam, wherein positional information about the alignment mark is detected on the basis of the diffracted light.

20. The mark detector according to claim 19, wherein the alignment mark is formed by an STI process.

21. The mark detector according to claim 19, wherein the coherent beam includes a beam having a wavelength between 800 and 1500 nm.

22. The mark detector according to claim 19, wherein the film includes polysilicon.

23. The mark detector according to claim 19, wherein the irradiating system irradiates the alignment mark with two mutually coherent light beams; and the receiving system receives a pair of diffracted light beams produced in the same direction from the alignment mark by the irradiation with the coherent beams.

24. The mark detector according to claim 19, wherein the irradiating system irradiates the alignment mark with one coherent light beam and the receiving system receives a pair of diffracted light beams produced in different directions from the alignment mark.

25. An exposure apparatus which exposes a substrate with a predetermined pattern, which comprises the mark detector defined in claim 19, and aligns the substrate with the predetermined pattern on the basis of positional information detected about the alignment mark by the mark detector.

26. The exposure apparatus according to claim 25, further comprising a projection system which projects the predetermined pattern onto the substrate and wherein the receiving system receives, through the projection system, the diffracted light produced from the alignment mark.

27. The exposure apparatus according to claim 26, wherein the predetermined pattern is formed on a mask, and the receiving system receives, through the projection system and the mask, the diffracted light produced from the alignment mark.

28. The exposure apparatus according to claim 25, further comprising a projection system which projects the predetermined pattern onto the substrate and wherein the receiving system receives the diffracted light produced from the alignment mark without being passed through the projection system.

29. A method of producing an exposure apparatus which exposes a substrate with a predetermined pattern, comprising:

providing an irradiating system which irradiates, with a coherent light beam in an infrared wavelength band through a film which transmits substantially no visible light, an alignment mark formed on a substrate and covered with the film, the alignment mark having a recess in which an insulator is embedded;

providing a receiving system which receives diffracted light produced from the alignment mark by the irradiation with the coherent beam;

providing a detecting system which detects positional information about the alignment mark on the basis of the diffracted light; and providing an aligning system which aligns the substrate with the predetermined pattern on the basis of the positional information about the alignment mark.

* * * * *